United States Patent
Koike

(10) Patent No.: US 10,138,550 B2
(45) Date of Patent: Nov. 27, 2018

(54) FILM DEPOSITION METHOD AND AN APPARATUS

(71) Applicant: TOSHIBA MEMORY CORPORATION, Minato-ku (JP)

(72) Inventor: Soh Koike, Yokkaichi (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 422 days.

(21) Appl. No.: 14/644,710

(22) Filed: Mar. 11, 2015

(65) Prior Publication Data

US 2016/0070831 A1 Mar. 10, 2016

Related U.S. Application Data

(60) Provisional application No. 62/048,578, filed on Sep. 10, 2014.

(51) Int. Cl.
*C23C 16/00* (2006.01)
*G06F 17/00* (2006.01)
*C23C 16/04* (2006.01)
*C23C 16/40* (2006.01)
*G06F 17/50* (2006.01)

(52) U.S. Cl.
CPC ......... *C23C 16/045* (2013.01); *C23C 16/402* (2013.01); *G06F 17/5009* (2013.01)

(58) Field of Classification Search
CPC ...... G06F 17/50; C23C 16/045; C23C 16/402
See application file for complete search history.

(56) References Cited

U.S. PATENT DOCUMENTS

| | | | | |
|---|---|---|---|---|
| 5,416,729 A | * | 5/1995 | Leon | G06F 17/5018 345/420 |
| 5,745,388 A | * | 4/1998 | Mimotogi | G06F 17/5018 716/51 |
| 5,889,686 A | * | 3/1999 | Mimotogi | G06F 17/5018 257/336 |
| 5,920,792 A | * | 7/1999 | Lin | H01L 21/02164 257/E21.244 |
| 6,165,555 A | * | 12/2000 | Jun | C23C 16/18 257/E21.17 |

(Continued)

FOREIGN PATENT DOCUMENTS

| JP | 4-216646 | 8/1992 |
|---|---|---|
| JP | 8-136236 | 5/1996 |

(Continued)

OTHER PUBLICATIONS

S. K. Yao, Theoretical model of thin-film deposition profile with shadow effect, J. Appl. Phys. 50(5), May 1979, p. 3390-3395 (Year: 1979).*

*Primary Examiner* — Aniss Chad
*Assistant Examiner* — Chuen-Meei Gan
(74) *Attorney, Agent, or Firm* — Oblon, McClelland, Maier & Neustadt, L.L.P.

(57) ABSTRACT

A shape computing method that determines a shape of a deposited film formed in a groove includes determining a solid angle for a reference point on a side surface of the groove. The shape computing method includes determining a thickness of the deposited film formed at the reference point in a reference deposition time based on a correlation between the solid angle and the thickness of the deposited film formed in the reference deposition time. The shape computing method includes determining the shape of the deposited film in a region in which the reference point lies based on the determined thickness.

15 Claims, 6 Drawing Sheets

(A)

(B)

(56) References Cited

U.S. PATENT DOCUMENTS

| | | | | |
|---|---|---|---|---|
| 2003/0163295 A1* | 8/2003 | Jakatdar | ............... | G06F 17/5009 703/14 |
| 2003/0229412 A1* | 12/2003 | White | ................. | G06F 17/5068 700/121 |
| 2005/0168758 A1* | 8/2005 | Hayasaki | ............ | G03F 7/70625 356/630 |
| 2008/0170241 A1* | 7/2008 | Chard | ..................... | H01L 22/12 356/625 |
| 2008/0170242 A1* | 7/2008 | Chard | ..................... | G01N 23/20 356/625 |
| 2008/0220546 A1* | 9/2008 | Kinoshita | ............... | H01L 22/20 438/16 |
| 2009/0089727 A1* | 4/2009 | Iyanagi | ............... | G06F 17/5081 716/106 |
| 2011/0082577 A1* | 4/2011 | Kuboi | ................. | G06F 17/5009 700/98 |
| 2011/0307845 A1* | 12/2011 | Taguchi | .............. | G06F 17/5068 716/55 |
| 2014/0005991 A1* | 1/2014 | Ono | .................... | G06F 17/5009 703/2 |
| 2015/0149131 A1* | 5/2015 | Kuboi | ................. | G06F 17/5009 703/2 |
| 2016/0070847 A1* | 3/2016 | Taguchi | .................... | G03F 1/36 716/53 |

FOREIGN PATENT DOCUMENTS

| | | |
|---|---|---|
| JP | 9-82938 | 3/1997 |
| JP | 2009-80349 | 4/2009 |
| JP | 2012-2830 | 1/2012 |

\* cited by examiner

FILM DEPOSITION METHOD AND AN APPARATUS

CROSS-REFERENCE TO RELATED APPLICATION

This application is based upon and claims the benefit of U.S. provisional Application No. 62/048,578, filed on Sep. 10, 2014, the entire contents of which are incorporated herein by reference.

BACKGROUND

Field

Embodiments described herein relate generally to a shape computing method and a simulation apparatus.

Background Art

In a process of manufacturing a semiconductor device, a deposited film is formed on a side wall of a groove by depositing a material on a substrate from above by chemical vapor deposition (CVD), for example. In a conventional simulation of the shape of a deposited film, the shape of the deposited film is computed in order to predict an air gap between formed deposited films, for example.

In the conventional topography simulation for deposited film, the region to be simulated by computation is limited by restrictions concerning computation time, memory or the like.

BRIEF DESCRIPTION OF THE DRAWINGS

FIG. 2(A) is a top plan view of a substrate on which circuit patterns (grooves) are formed, and FIG. 2(B) is a vertical cross-sectional view of the substrate taken along the line A-A in FIG. 2(A);

DETAILED DESCRIPTION

A shape computing method, according to an embodiment, that determines a shape of a deposited film formed in a groove includes determining a solid angle for a reference point on a side surface of the groove. The shape computing method includes determining a thickness of the deposited film formed at the reference point in a reference deposition time based on a correlation between the solid angle and the thickness of the deposited film formed in the reference deposition time. The shape computing method includes determining the shape of the deposited film in a region in which the reference point lies based on the determined thickness.

Figure 1:
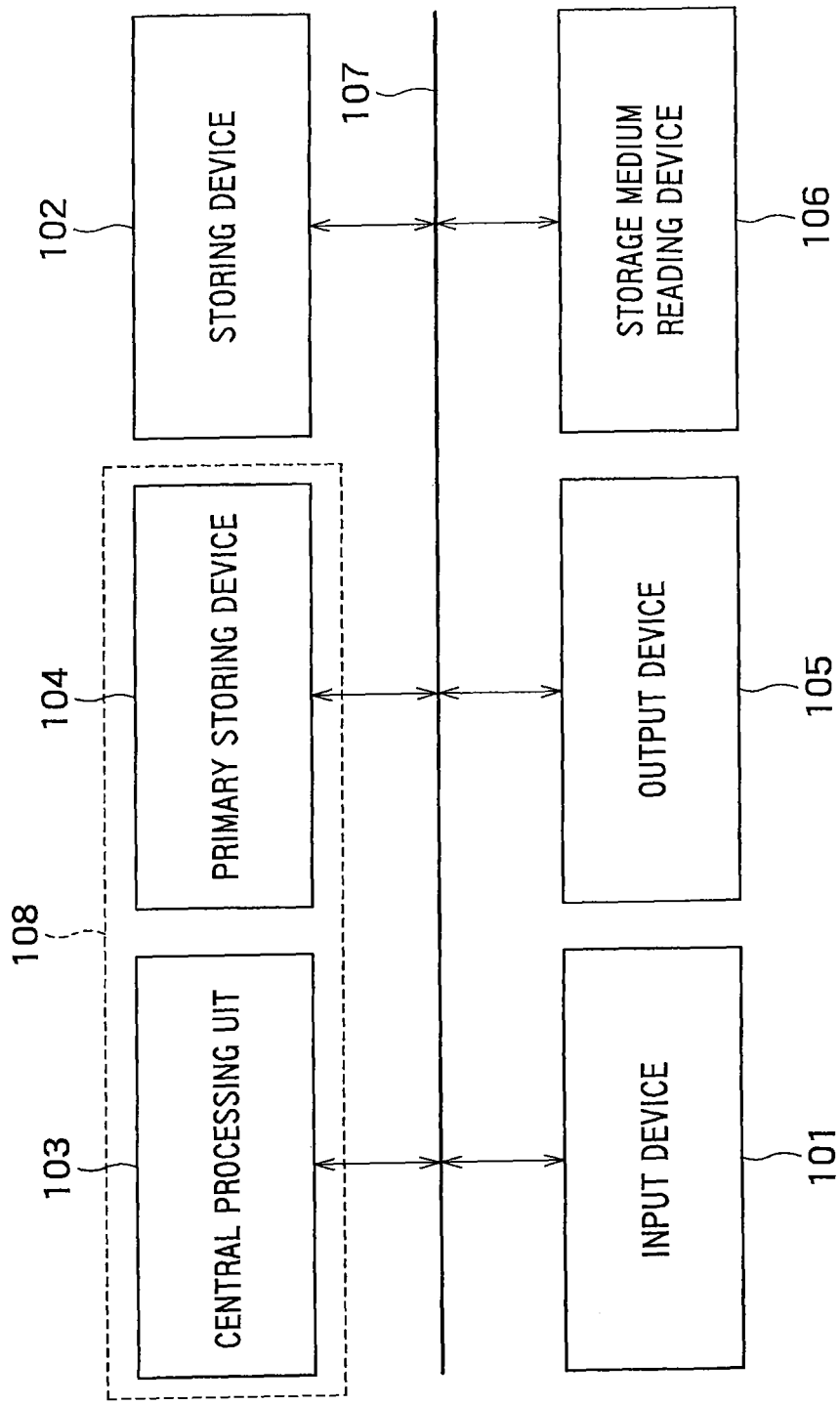
FIG. 1 is a block diagram showing a schematic configuration of the simulation apparatus according to this embodiment.

First, a simulation apparatus according to an embodiment will be described. FIG. 1 is a block diagram showing a schematic configuration of the simulation apparatus according to this embodiment. As shown in FIG. 1, the simulation apparatus includes an input device 101, a storing device 102, a central processing unit (CPU) 103, a primary storing device (memory) 104, an output device 105, a storage medium reading device 106, and a bus line 107.

The input device 101 is a user interface, such as a keyboard or a mouse. The input device 101 is used to input information on a simulation condition, such as a two-dimensional cross section of a groove (pattern) formed in a substrate to be machined.

The storing device 102 is a hard disk drive, for example. The storing device 102 stores the input simulation condition and a simulation program that implements a shape computing method for a deposited film formed in a groove according to this embodiment.

The central processing unit 103 and the primary storing device 104 function as a computing device 108. The computing device 108 implements the shape computing method for a deposited film according to this embodiment according to the simulation program and the simulation condition stored in the storing device 102.

Information on the simulated shape of the deposited film obtained by computation by the computing device 108 is stored in the storing device 102 as a file, for example.

The output device 105 is a display or a printer, for example. The output device 105 outputs the simulated shape of the deposited film obtained by computation by the computing device 108. For example, based on the information on the simulated shape of the deposited film stored in the storing device 102, an image of the deposited film having the simulated shape is displayed on a display. Furthermore, an image of the deposited film having the simulated shape displayed on the display is output from a printer.

The recording medium reading device 106 reads data from a recording medium. The devices 101 to 106 are connected to each other by the bus line 107.

Next, a solid angle for a reference point used in the shape computing method according to this embodiment will be described.

Figure 2:
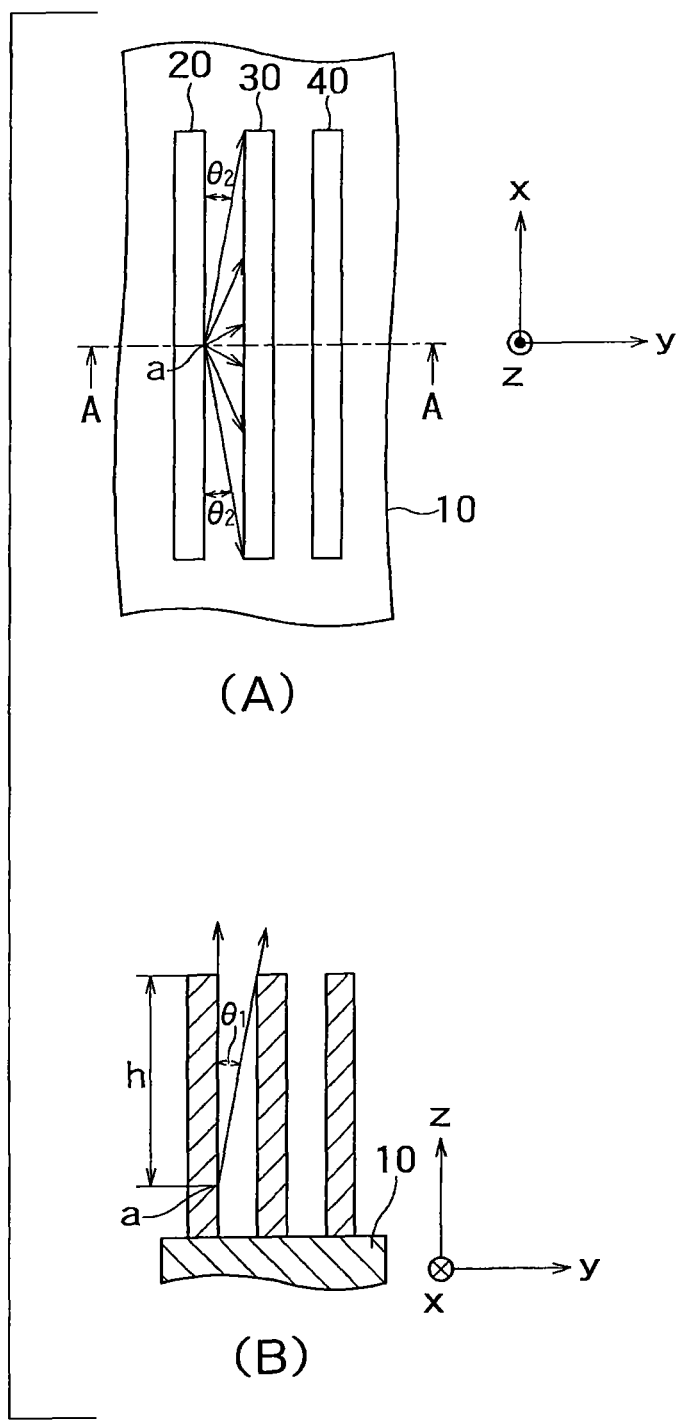
FIG. 2 are diagrams showing an example of a relationship between a reference point and a solid angle.

FIG. 2 are diagrams showing an example of a relationship between a reference point and a solid angle. FIG. 2(A) is a top plan view of a substrate on which circuit patterns (grooves) are formed. FIG. 2(B) is a vertical cross-sectional view of the substrate taken along the line A-A in FIG. 2(A).

Arrows in the drawings indicate rays extending from a reference point "a" on a surface of a side wall 20 of a groove. Grooves are formed by a bottom surface of a substrate 10, which is a principal plane of the substrate 10, and side walls formed by patterns 20, 30 and 40. In FIG. 2, it is supposed that the +Z direction is the upward direction, and the −Z direction is the downward direction (the same holds true for FIGS. 4 and 5 described later).

As shown in FIG. 2(A), an angle $\theta_2$ falls in a range in which a ray extending from the reference point "a" on the surface of the side wall 20 of the groove does not intersect with the side walls 20 and 30 of the groove and the bottom surface of the groove (principal plane of the substrate 10).

As shown in FIG. 2(B), an angle $\theta_1$ falls in a range in which a ray extending from the reference point "a" does not intersect with the side walls 20 and 30 of the groove and the bottom surface of the groove.

The angle $\theta_1$ in the direction perpendicular to the principal plane of the substrate 10 varies with the vertical position (height "h") of the reference point "a" on the side wall 20 of the groove. Specifically, as the height "h" decreases, the angle $\theta_1$ increases, and the solid angle also increases. As the distance between the side wall 20 and the side wall 30 of the groove increases, the angles $\theta_1$ and $\theta_2$ increase, and the solid angle also increases.

In this embodiment, the solid angle is an angle of a part of a spherical surface formed by the rays extending from the reference point "a", the part being formed by rays that do not interfere with the surface of the adjacent side wall 20 or 30 of the groove or the bottom surface of the groove. In other words, the solid angle for the reference point "a" is the area of a region of a spherical surface of a reference radius centered at the reference point "a" with which rays intersect without intersecting with the surface of the side wall 20 or 30 of the groove or the bottom surface of the groove divided by the square of the reference radius.

That is, the solid angle for the reference point "a" is computed or in other words obtained by dividing the area of the region of a spherical surface of a reference radius centered at the reference point "a" with which rays extending from the reference point on a side surface of the groove intersect without intersecting with the surface of any side wall of the groove or the bottom surface of the groove by the square of the reference radius.

Next, a relationship between the solid angle defined as described above and the thickness of the deposited film formed in the groove in a preset reference deposition time will be described.

The thickness of the deposited film is determined by subtraction between images of the two-dimensional cross-sectional shape of the groove taken by a scanning electron microscope (SEM) before and after the material is deposited for the reference deposition time. The reference deposition time is a time required to form a deposited film on an upper part of a groove to a prescribed thickness (10 nm, for example), for example. Alternatively, the thickness of the deposited film may be determined by the measurement of the difference between two-dimensional cross-sectional shapes before and after deposition simulation of a groove, for example.

Figure 3:
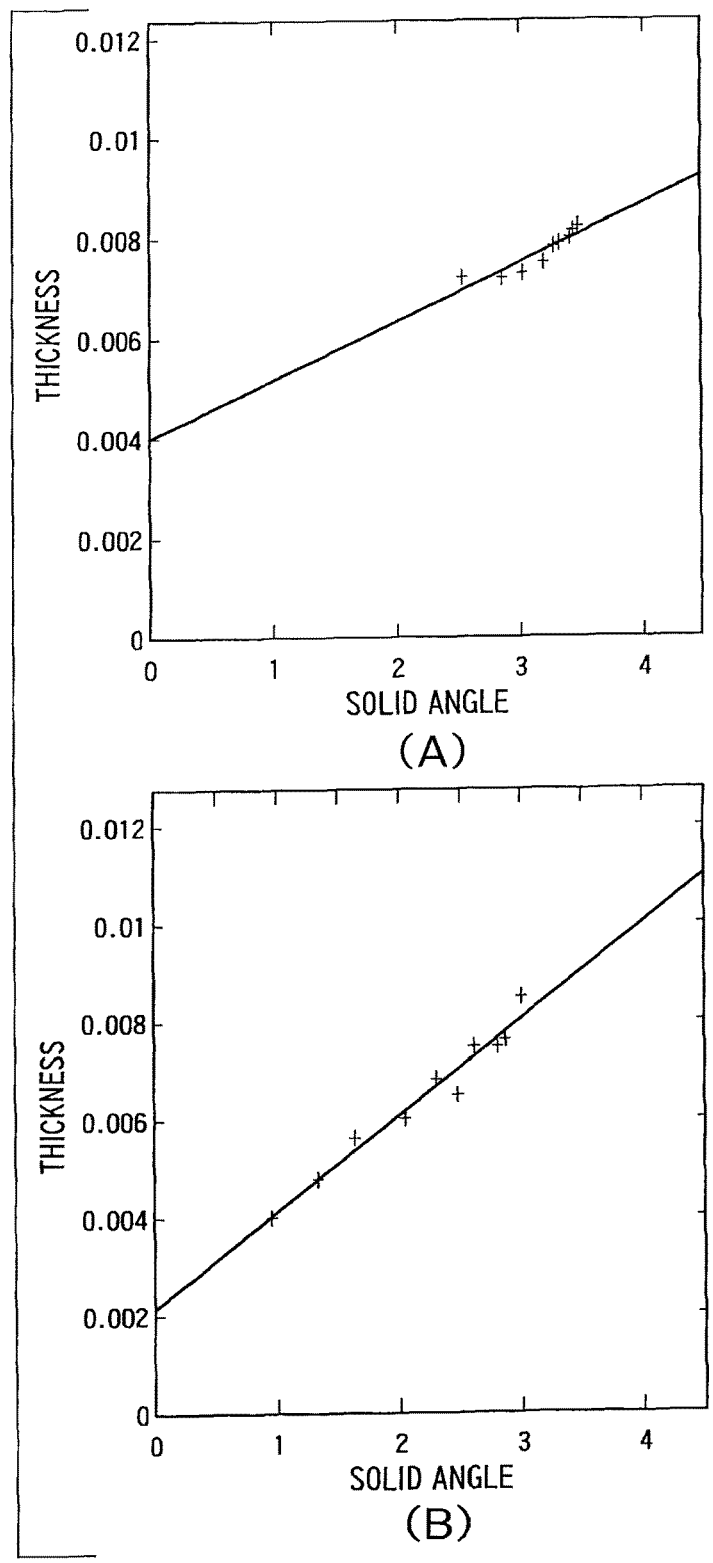
FIG. 3 are graphs showing relationships between the thickness of the deposited film formed on a side surface of a groove in the reference deposition time and the solid angle.

FIG. 3 are graphs showing relationships between the thickness of the deposited film formed on a side surface of a groove in the reference deposition time and the solid angle. FIG. 3(A) is a characteristic diagram showing a case where the reference point lies in a first region "h1" extending from the upper edge of the groove to a certain point in the downward direction, and FIG. 3(B) is a characteristic diagram showing a case where the reference point lies in a region below the first region "h1".

The approximate lines in FIGS. 3(A) and 3(B) show relationships between the solid angle and the measured thickness of the film deposited on the side wall. The approximate lines in FIGS. 3(A) and 3(B) differ in slope and intercept. As can be seen from this comparison, depending on the vertical position of the reference point on the side surface of the groove, the relationship between the solid angle and the thickness of the film deposited on the side wall can substantially vary.

Next, a model (correlation) that prescribes the relationship between the solid angle and the thickness of the deposited film formed in the reference deposition time will be described.

As described above, the relationship between the solid angle and the thickness of the film deposited in the reference deposition time varies with the position of the reference point. In view of this, the model that prescribes the relationship between the solid angle and the film thickness is changed depending on the vertical position of the reference point on the side surface of the groove.

For example, if the reference point lies in the first region extending from the upper edge of the groove to a certain point in the downward direction, a first model is used to compute the thickness of the deposited film formed in the reference deposition time.

If the reference point lies in a second region below the first region, a second model, which is different from the first model, is used to compute the thickness of the deposited film formed in the reference deposition time.

The following formula (1) is a function of the first model that prescribes the relationship between the solid angle and the film thickness in the case where the reference point lies in the first region. In the formula (1), "X" denotes the solid angle for the reference point, and "$A_1$" and "$B_1$" each denote a constant. "f1(X)" In this formula (1) corresponds to the approximate line in FIG. 3(A).

$$f1(X) = A_1 \times X + B_1 \quad (1)$$

The following formula (2) is a function of the second model that prescribes the relationship between the solid angle and the film thickness in the case where the reference point lies in the second region. In the formula (2), "X" denotes the solid angle for the reference point that lies in the second region, and "$A_2$" and "$B_2$" each denote a constant. "f2(X)" in this formula (2) corresponds to the approximate line in FIG. 3(B).

$$f2(X) = A_2 \times X + B_2 \quad (2)$$

As can be seen from the above description, the models prescribed by the formulas (1) and (2) are very simple linear functions, so that the computation time can be substantially reduced. And, the model that prescribes the relationship between the solid angle and the film thickness is changed depending on the vertical position of the reference point on the side surface of the groove. In this way, even if the characteristics of formation of the deposited film vary with the vertical position of the reference point on the side surface of the groove, a film thickness close to the actual value can be obtained.

The values "$A_1$", "$B_1$", "$A_2$" and "$B_2$" are appropriately determined based on the actual values or the like obtained under the various specific conditions described above. That is, the models are prescribed based on the relationship between the solid angle for the reference point on the side surface of the groove and the actual value of the thickness of the deposited film formed at the reference point.

The material to be deposited by CVD is a silicon oxide film such as densified tetra ethyl orthosilicate (DTEOS) or plasma silane gas ($PSiH_4$), for example. Thus, the first and second models are set for the case where DTEOS is deposited. Furthermore, the first and second models for $PSiH_4$ are set for the case where $PSiH_4$ is deposited. In this way, a more suitable one of the models is used depending on the material to be deposited. For example, when $PSiH_4$ is deposited and then a silicon oxide is deposited, the thickness of the deposited film is computed using the first and second models for $PSiH_4$, and then the thickness of the deposited film is computed using the first and second models for the silicon oxide.

Next, as an example, a shape computing method of computing the shape of the deposited film using the first and second models will be described.

Figure 4:
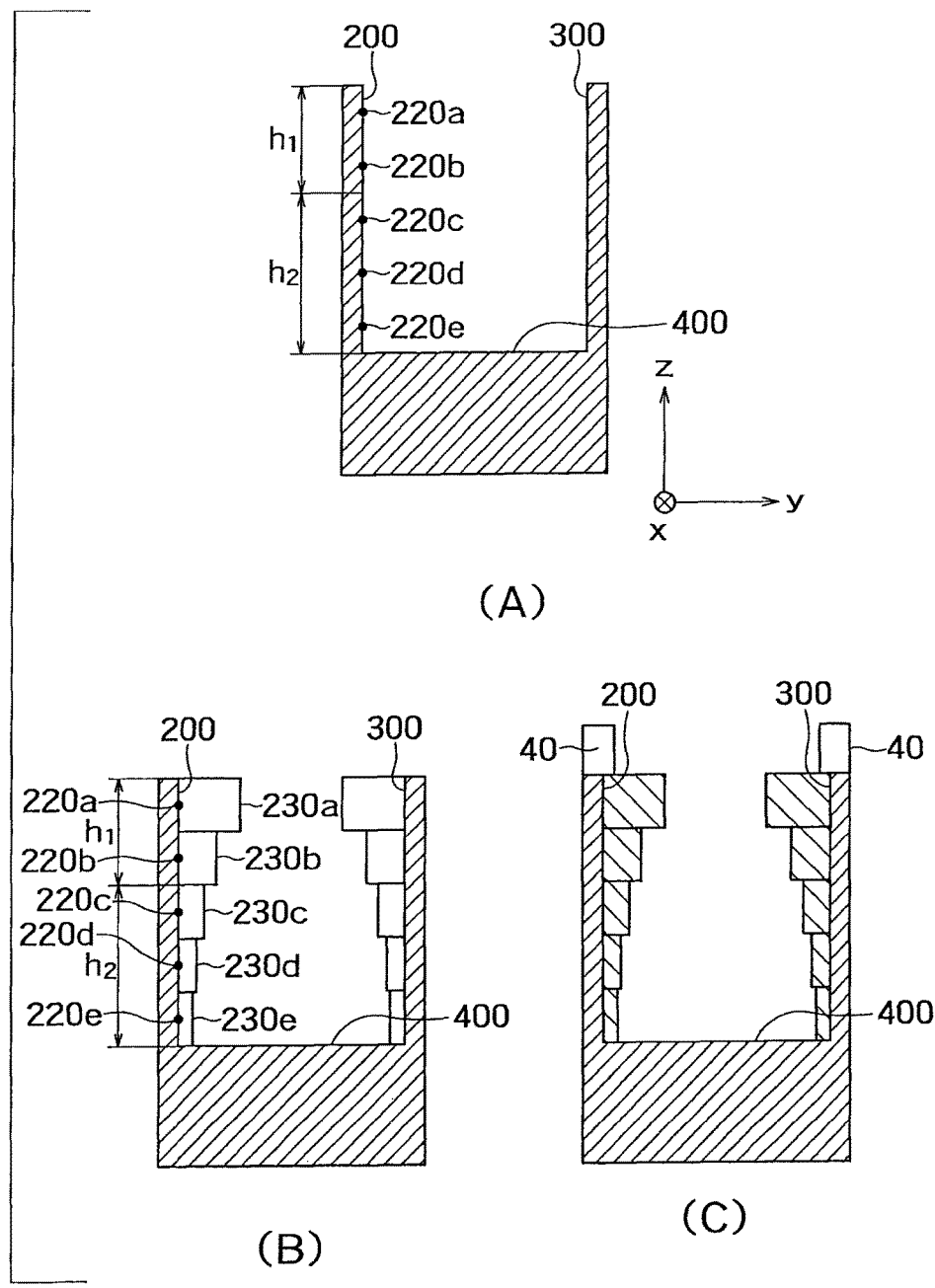
FIG. 4 is a schematic cross-sectional view showing an example of a process of formation of a deposited film on side surfaces of a groove with lapse of time during the reference deposition time.
Figure 5:
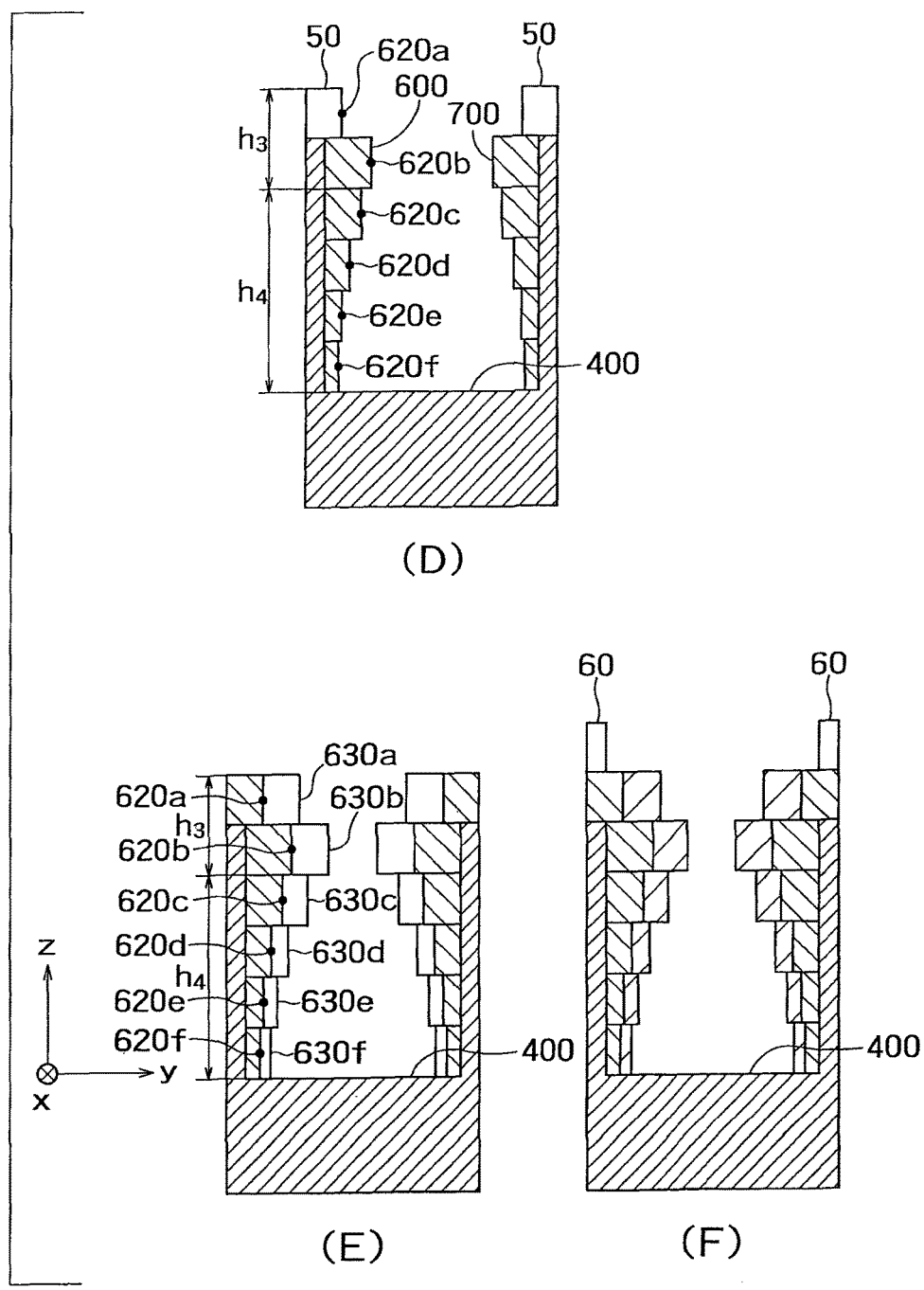
FIG. 5 is a schematic cross-sectional view showing an example of a process of formation of a deposited film on side surfaces of a groove with lapse of time during the reference deposition time.
Figure 6:
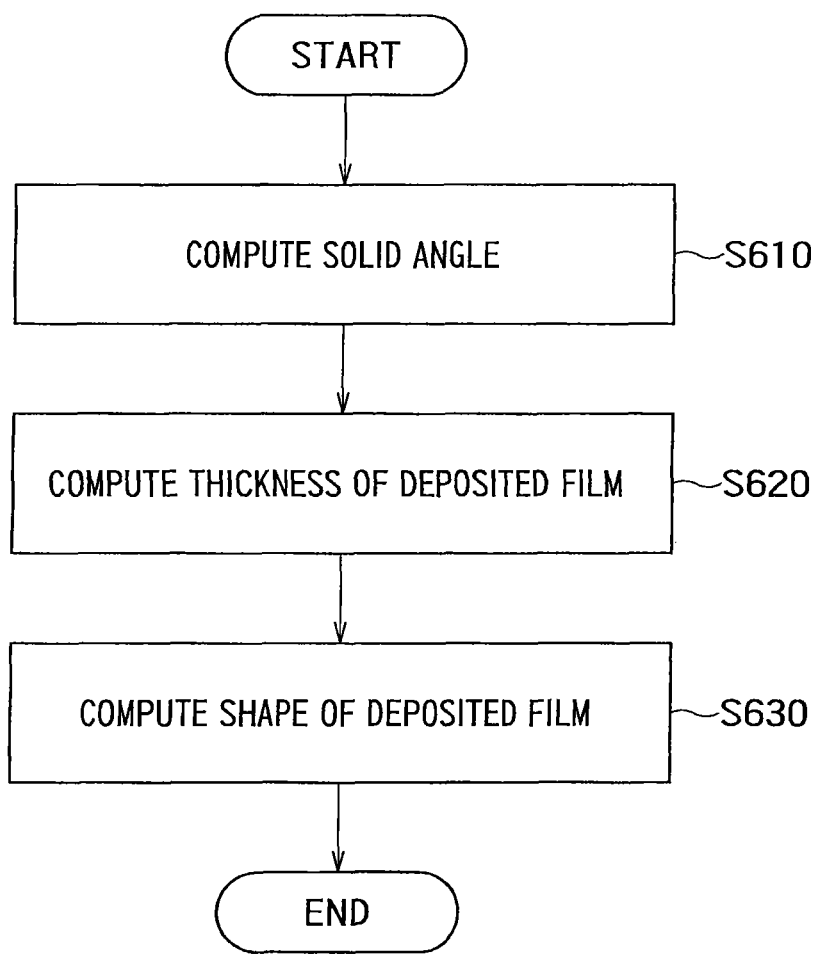
FIG. 6 is a flowchart showing an example of a method of computing the shape of a deposited film according to this embodiment.

FIGS. 4 and 5 are schematic cross-sectional views showing an example of a process of formation of a deposited film on side surfaces of a groove with lapse of time during the reference deposition time. FIG. 6 is a flowchart showing an example of a method of computing the shape of a deposited film according to this embodiment. The flow shown in FIG. 6 is a flow of a process of forming a deposited film in the reference deposition time, and the flow is repeated until the thickness of the deposited film reaches a predetermined thickness.

As shown in FIG. 4(A), a groove is formed by side surfaces 200 and 300 and a bottom surface 400.

The side surfaces 200 and 300 of the groove are divided into the first region "h1" that extends from the upper edge of the side surfaces 200 and 300 to a certain point in the downward direction and the second region "h2" below the first region "h1". In this case, reference points (first reference points) 220a and 220b lie in the first region "h1", and reference points (second reference points) 220c, 220d and 220e lie in the second region "h2". In this way, a plurality of reference points are provided on the side surface 200 or 300 of the groove along the vertical direction. Data on the cross-sectional shape of the groove is input to the computing device 108.

The computing device 108 computes the solid angle for each of the reference points 220a to 220e on the side surface 200 of the groove by dividing the area of the region of the spherical surface of the reference radius centered at the reference point 220a to 220e with which rays extending from the reference point 220a to 220e intersect without intersecting with the side surface 200 or 300 or the bottom surface 400 of the groove by the square of the reference radius (Step S610 in FIG. 6). In this way, the solid angles for the reference points 220a to 220e are computed.

The computing device 108 then computes the thickness of the deposited film formed at each of the reference points 220a to 220e in the reference deposition time using the above-described models that prescribe the relationship between the solid angle and the thickness of the deposited film formed in the reference deposition time (Step S620 in FIG. 6).

In this step, since the reference points 220a and 220b lie in the first region "h1" that extends from the upper edge of the groove in the downward direction, the thicknesses of the deposited film formed at the reference points 220a and 220b in the reference deposition time are computed using the first model. Since the reference points 220c to 220e lie in the second region "h2" below the first region, the thicknesses of the deposited film formed at the reference points 220c to 220e in the reference deposition time are computed using the second model.

As shown in FIG. 4(B), the computing device 108 then computes the shape of deposited films 230a to 230e in the first and second regions "h1" and "h2" in which the reference points 220a to 220e lie, based on the computed thickness of the deposited film formed in the reference deposition time at each of the reference points 220a to 220e (Step S630 in FIG. 6).

In this example, the computed cross-sectional shapes of the deposited films 230a to 230e at the reference points 220a to 220e are rectangles. The length of the horizontal side of the rectangle corresponds to the thickness of the deposited film formed in the reference deposition time.

As shown in FIG. 4(C), the computing device 108 then computes the shape of a deposited film 40 having a predetermined shape added to the upper edge part of the groove. The height of the added deposited film 40 is set based on the thickness of a film deposited without a base structure in the reference deposition time, for example. The width of the added deposited film 40 is set based on the width of the upper edge part of the groove, for example.

If the film deposition is to be continued, as shown in FIG. 5(B), the shape of the deposited film on the upper edge part of the groove is changed so that the shape of the deposited film formed on the side surface of the groove comes closer to the actual shape.

As shown in FIG. 5(D), in order to compute the shape of the deposited film formed on the side walls of the groove extended by the deposited film 50, the computing device 108 partitions the side walls 200 and 300 of the groove extended by the deposited film 50 into a first region "h3" extending from the upper edge in the downward direction and a second region "h4" below the first region "h3". In this case, reference points (first reference points) 620a and 620b lie in the first region "h3", and reference points (second reference points) 620c, 620d, 620e and 620f lie in the second region "h4".

In this way, the reference points 620a to 620f are set by regarding the surface of the deposited film formed on the side surface of the groove formed in the first reference deposition time as the side surface of the groove.

The computing device 108 then computes the solid angle for each of the reference points 620a to 620f on the side surface of the groove by dividing the area of the region of the spherical surface of the reference radius centered at the reference point 620a to 620f with which rays extending from the reference point 620a to 620f intersect without intersecting with any side surface or the bottom surface 400 of the groove by the square of the reference radius (Step S610 in FIG. 6). In this way, the solid angles for the reference points 620a to 620f are computed.

The computing device 108 then computes the thickness of the deposited film formed at each of the reference points 620a to 620f in the reference deposition time using the above-described models that prescribe the relationship between the solid angle and the thickness of the deposited film formed in the reference deposition time (Step S620 in FIG. 6).

In this step, since the reference points 620a and 620b lie in the first region "h3", the thicknesses of the deposited film formed at the reference points 620a and 620b in the reference deposition time are computed using the first model. Since the reference points 620c to 620f lie in the second region "h4", the thicknesses of the deposited film formed at the reference points 620c to 620f in the reference deposition time are computed using the second model.

As shown in FIG. 5(E), the computing device 108 then computes the shape of deposited films 630a to 630f in the first and second regions "h3" and "h4" in which the reference points 620a to 620f lie, based on the computed thickness of the deposited film formed in the reference deposition time at each of the reference points 620a to 620f (Step S630 in FIG. 6).

In this example, the computed cross-sectional shapes of the deposited films 630a to 630f at the reference points 620a to 620f are rectangles. The length of the horizontal side of the rectangle corresponds to the thickness of the deposited film formed in the reference deposition time.

If computation for the next reference deposition time is to be performed, as shown in FIG. 5(F), the computing device 108 then computes the shape of a deposited film 60 having a predetermined shape added to the upper edge part of the groove. The height of the added deposited film 60 is set based on the thickness of a film deposited without a base structure in the reference deposition time, for example. The width of the added deposited film 60 is set based on the width of the upper edge part of the groove, for example.

The same flow is repeated until the thickness of the deposited film eventually reaches a predetermined value.

As described above, according to the shape computing method according to this embodiment, models that prescribe the relationship between the solid angle and the thickness of the deposited film formed in the reference deposition time are used to compute the thickness of the deposited film formed at a reference point in the reference deposition time. That is, the shape of the deposited film formed in a groove can be computed using relatively simple models that have less restriction concerning computation time and memory. Therefore, the computation time can be reduced, and the region to be simulated can be expanded.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A film deposition method deposit a film in a groove, comprising:
    determining a thickness of a film to be deposited in the groove at several reference points comprising,
    determining a solid angle for the several reference points on a side surface of the groove by a calculating device;
    determining the thickness of the film to be formed at the several reference points in a reference deposition time based on a deposition model defining a predetermined correlation between the solid angle and the thickness of the film formed in the reference deposition time by the calculating device, the deposition time includes a first deposition time and a second deposition time after the first deposition time, wherein the thickness during the first deposition time is determined at a first reference point that lies in a first region extending from an upper edge of the groove in a downward direction by applying a first correlation and a second reference point that lies in a second region below the first region by applying a second correlation, and the thickness during the second deposition time is determined at a third reference point that lies in a third region extending from an upper edge of the film to be deposited on the groove during the first deposition time in the downward direction by applying a third correlation, the upper edge of the film being higher than the upper edge of the groove, and a fourth reference point that lies in a fourth region below the third region by applying a fourth correlation;
    determining a shape of the film to be deposited in a region in which the several reference points lies based on the determined thickness by the calculating device; and
    depositing the film based on the determined shape on the side surface of the groove by chemical vapor deposition.

2. The film deposition method according to claim 1, wherein the predetermined correlation is changed depending on a position of each of the reference points on the side surface of the groove in a vertical direction.

3. The film deposition method according to claim 1, wherein the first correlation differs from the second correlation.

4. The film deposition method according to claim 1, wherein the predetermined correlation is prescribed based on a relationship between the solid angle for each of the reference points on the side surface of the groove and an actual value of the thickness of the deposited film formed at each of the reference points.

5. The film deposition method according to claim 1, wherein the shape of the deposited film is determined by adding a film having a predetermined shape to an upper edge part of the groove.

6. The film deposition method according to claim 5, wherein the shape of the film is changed.

7. The film deposition method according to claim 1, wherein the solid angle is determined by dividing an area of a region of a spherical surface of a reference radius centered at each of the reference points with which a ray extending from each of the reference points on the side surface of the groove intersects without intersecting with any side surface or a bottom surface of the groove by the square of the reference radius.

8. The film deposition method according to claim 1, wherein the solid angle is determined based on the shape of time-varying side face of the groove.

9. A film deposition apparatus, comprising:
    an input device used to input a simulation condition;
    a storing device that stores the simulation condition and a simulation program; and
    a computing device to determine a thickness of a film to be deposited in a groove at several reference points according to the simulation program and the simulation condition stored in the storing device configured to:
    determine a solid angle for the several reference points on a side surface of the groove;
    determine the thickness of the film to be formed at the several reference points in a reference deposition time based on a deposition model defining a predetermined correlation between the solid angle and the thickness of the film formed in the reference deposition time, the deposition time includes a first deposition time and a second deposition time after the first deposition time, wherein the thickness during the first deposition time is determined at a first reference point that lies in a first region extending from an upper edge of the groove in a downward direction by applying a first correlation and a second reference point that lies in a second region below the first region by applying a second correlation, and the thickness during the second deposition time is determined at a third reference point that lies in a third region extending from an upper edge of the film to be deposited on the groove during the first deposition time in the downward direction by applying a third correlation, the upper edge of the film being higher than the upper edge of the groove, and a fourth reference point that lies in a fourth region below the third region by applying a fourth correlation; and
    determine a shape of the film to be deposited in a region in which the several reference point lies based on the determined thickness; and
    a chemical vapor deposition device configured to deposit the film based on the determined shape on the side surface of the groove under control of the computing device.

10. The film deposition apparatus according to claim 9, wherein the computing device changes the predetermined correlation depending on a position of the reference points on the side surface of the groove in a vertical direction.

11. The film deposition apparatus according to claim 9, wherein the first correlation differs from the second correlation.

12. The film deposition apparatus according to claim 9, wherein the predetermined correlation is prescribed based on a relationship between the solid angle for each of the reference points on the side surface of the groove and an actual value of the thickness of the deposited film formed at each of the reference points.

13. The film deposition apparatus according to claim 9, wherein the computing device determines the shape of the deposited film by adding a film having a predetermined shape to an upper edge part of the groove.

14. The film deposition apparatus according to claim 13, wherein the computing device changes the shape of the film.

15. The film deposition apparatus according to claim 9, wherein the computing device determines the solid angle by dividing an area of a region of a spherical surface of a reference radius centered at each of the reference points with which a ray extending from each of the reference points on the side surface of the groove intersects without intersecting with any side surface or a bottom surface of the groove by the square of the reference radius.

* * * * *